US012077437B2

United States Patent
Azenkeng et al.

(10) Patent No.: US 12,077,437 B2
(45) Date of Patent: Sep. 3, 2024

(54) GRAPHENE FILMS FROM CARBON SOURCES

(71) Applicant: Energy and Environmental Research Center Foundation, Grand Forks, ND (US)

(72) Inventors: Alexander Azenkeng, Grand Forks, ND (US); James Tibbetts, Grand Forks, ND (US); Jason Laumb, Grand Forks, ND (US)

(73) Assignee: Energy and Environmental Research Center Foundation, Grand Forks, ND (US)

( * ) Notice: Subject to any disclaimer, the term of this patent is extended or adjusted under 35 U.S.C. 154(b) by 163 days.

(21) Appl. No.: 17/445,896

(22) Filed: Aug. 25, 2021

(65) Prior Publication Data

US 2022/0064006 A1    Mar. 3, 2022

Related U.S. Application Data

(60) Provisional application No. 62/706,618, filed on Aug. 28, 2020.

(51) Int. Cl.
| | |
|---|---|
| *B32B 9/00* | (2006.01) |
| *C01B 32/182* | (2017.01) |
| *C01B 32/186* | (2017.01) |
| *C23C 16/26* | (2006.01) |
| *C23C 16/448* | (2006.01) |

(52) U.S. Cl.
CPC .......... *C01B 32/186* (2017.08); *C01B 32/182* (2017.08); *C23C 16/26* (2013.01); *C23C 16/4481* (2013.01); *C01P 2002/82* (2013.01); *C01P 2002/85* (2013.01); *C01P 2004/02* (2013.01); *C01P 2004/03* (2013.01)

(58) Field of Classification Search
CPC ....... Y10T 428/30; B82Y 30/00; B32B 9/007; C03C 16/26; C01B 32/182; C01B 32/186
USPC ......................................................... 428/408
See application file for complete search history.

(56) References Cited

U.S. PATENT DOCUMENTS

2012/0161098 A1 *  6/2012  Hiura ................... H01L 29/165
977/734

FOREIGN PATENT DOCUMENTS

WO    WO 2013/154997    * 10/2013

OTHER PUBLICATIONS

An investigation of growth mechanism of coal derived graphene films, Santosh (Materials Today Communications (2017)) p. 147-155.*

* cited by examiner

*Primary Examiner* — Daniel H Miller
(74) *Attorney, Agent, or Firm* — Schwegman Lundberg & Woessner, P.A.

(57) ABSTRACT

Methods and apparatuses for forming a graphene film, and graphene films produced thereby. A method of forming a graphene film includes depositing a carbon source onto a substrate within a deposition environment including a vacuum to form the graphene film on the substrate. The carbon source includes coal, a coal component, or a combination thereof.

16 Claims, 8 Drawing Sheets ure of 20° C.
GRAPHENE FILMS FROM CARBON SOURCES

CROSS-REFERENCE TO RELATED APPLICATION

This application claims the benefit of priority to U.S. Provisional Patent Application Ser. No. 62/706,618 filed Aug. 28, 2020, the disclosure of which is incorporated herein in its entirety by reference.

BACKGROUND

Graphene is the name denoted to a single sheet (1 atom thick) of $sp^2$-bonded carbon atoms. Effectively this is a single sheet of graphitic carbon. However, the term graphene has also come to be used to describe in a more general sense thin films (1-40 layers) of $sp^2$-bonded carbon under the auspices of discussions of single layer interactions and electrical behavior. Due to the difficulty in mass producing graphene films, it remains an extremely expensive material.

SUMMARY OF THE INVENTION

In various aspects, the present invention provides a method of forming a graphene film that includes depositing a carbon source onto a substrate within a deposition environment including a vacuum to form the graphene film on the substrate. The carbon source includes coal, a coal component, or a combination thereof.

In various aspects, the present invention provides a method of forming a graphene film that includes performing at least one evacuation/flush cycle at room temperature including evacuating the deposition environment to 1 kPa to 90 kPa and flushing the deposition environment with an inert gas. The method includes performing at least one heat/flush/evacuation cycle of the deposition environment including heating the deposition environment to 300° C. to 1000° C., flushing the deposition environment with an inert gas, and evacuating the deposition environment to a pressure of 1 kPa to 90 kPa. The method includes depositing a carbon source including particulate coal having a largest dimension smaller than 100 microns, a particulate component extracted from coal having a largest dimension smaller than 100 microns, or a combination thereof, onto a substrate a metal or an alloy thereof within the deposition environment including a vacuum of 1 kPa to 20 kPa to form the graphene film on the substrate. The deposition environment has an oxygen concentration of ≤0.01 vol %. The deposition includes cooling the deposition environment from an initial temperature of 800° C. to 1200° C. to a lower final temperature of 20° C. to 30° C.

In various aspects, the present invention provides a graphene film formed by an embodiment of the method.

In various aspects, the present invention provides a graphene film including a CVD-deposited carbon source. The carbon source includes coal, a component extracted from coal, or a combination thereof.

In various aspects, the present invention provides an apparatus for performing an embodiment of the method. The apparatus includes a chemical vapor deposition unit including a deposition environment. The apparatus also includes an injector unit that is configured to inject a carbon source entrained in a gas into the deposition environment for deposition on a substrate and formation of a graphene film thereon. The carbon source includes coal, a coal component, or a combination thereof.

Various embodiments of the present invention have certain advantages over other methods of forming graphene films. For example, in various embodiments, the method of the present invention can make graphene films that are one atom thick or multiple atoms thick from convenient carbon sources such as coal or natural gas. In various embodiments, the method of the present invention can be easily scaled-up to efficiently provide large amounts of graphene films. In various embodiments, the method of the present invention can utilize solid carbonaceous fuels in a CVD system. In various embodiments, the method of the present invention can be used to make graphene films and other products of coal pyrolysis or decomposition.

BRIEF DESCRIPTION OF THE FIGURES

The drawings illustrate generally, by way of example, but not by way of limitation, various embodiments of the present invention.

DETAILED DESCRIPTION OF THE INVENTION

Figure 1:
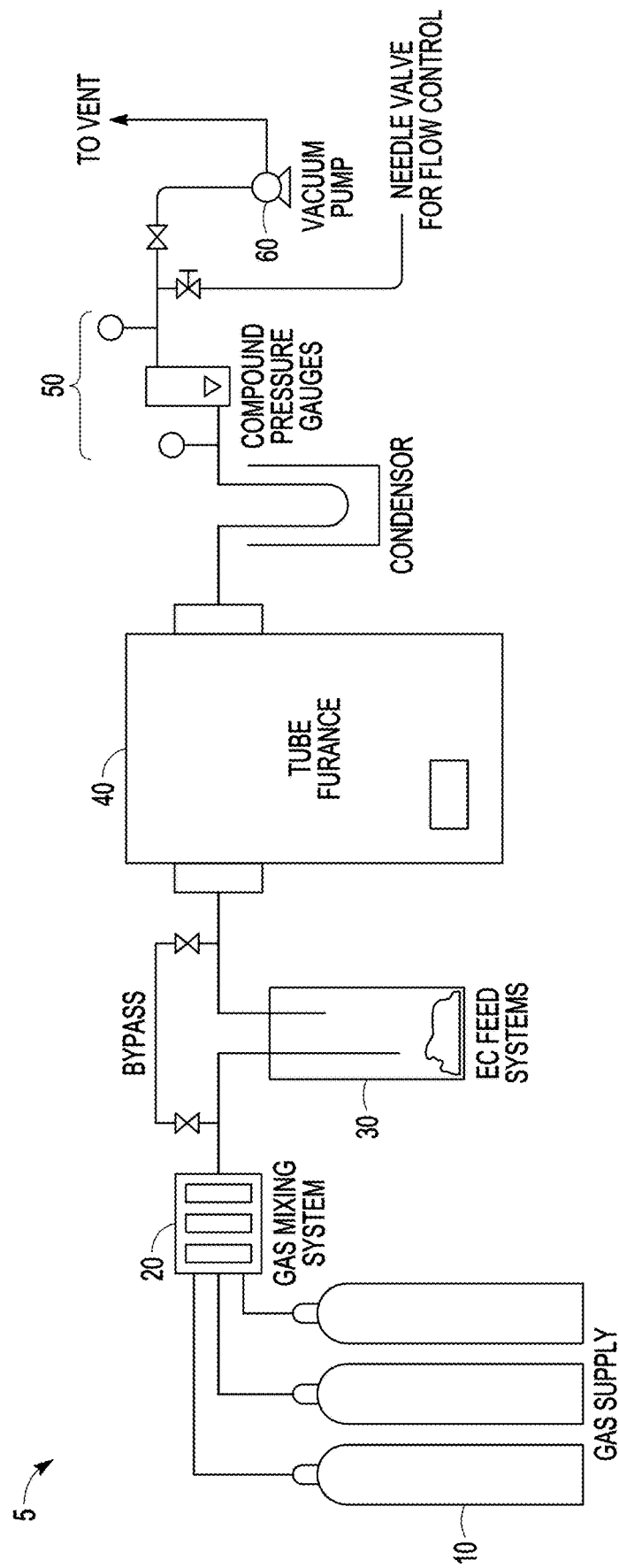
FIG. 1 illustrates a low pressure entrained-coal chemical vapor deposition system, in accordance with various embodiments.

Reference will now be made in detail to certain embodiments of the disclosed subject matter. While the disclosed subject matter will be described in conjunction with the enumerated claims, it will be understood that the exemplified subject matter is not intended to limit the claims to the disclosed subject matter.

Throughout this document, values expressed in a range format should be interpreted in a flexible manner to include not only the numerical values explicitly recited as the limits of the range, but also to include all the individual numerical values or sub-ranges encompassed within that range as if each numerical value and sub-range is explicitly recited. For example, a range of "about 0.1% to about 5%" or "about 0.1% to 5%" should be interpreted to include not just about 0.1% to about 5%, but also the individual values (e.g., 1%, 2%, 3%, and 4%) and the sub-ranges (e.g., 0.1% to 0.5%, 1.1% to 2.2%, 3.3% to 4.4%) within the indicated range. The statement "about X to Y" has the same meaning as "about X to about Y," unless indicated otherwise. Likewise, the statement "about X, Y, or about Z" has the same meaning as "about X, about Y, or about Z," unless indicated otherwise.

In this document, the terms "a," "an," or "the" are used to include one or more than one unless the context clearly dictates otherwise. The term "or" is used to refer to a nonexclusive "or" unless otherwise indicated. The statement "at least one of A and B" or "at least one of A or B" has the same meaning as "A, B, or A and B." In addition, it is to be understood that the phraseology or terminology employed herein, and not otherwise defined, is for the purpose of description only and not of limitation. Any use of section headings is intended to aid reading of the document and is not to be interpreted as limiting; information that is relevant to a section heading may occur within or outside of that particular section.

In the methods described herein, the acts can be carried out in any order without departing from the principles of the invention, except when a temporal or operational sequence is explicitly recited. Furthermore, specified acts can be carried out concurrently unless explicit claim language recites that they be carried out separately. For example, a claimed act of doing X and a claimed act of doing Y can be conducted simultaneously within a single operation, and the resulting process will fall within the literal scope of the claimed process.

The term "about" as used herein can allow for a degree of variability in a value or range, for example, within 10%, within 5%, or within 1% of a stated value or of a stated limit of a range, and includes the exact stated value or range.

The term "substantially" as used herein refers to a majority of, or mostly, as in at least about 50%, 60%, 70%, 80%, 90%, 95%, 96%, 97%, 98%, 99%, 99.5%, 99.9%, 99.99%, or at least about 99.999% or more, or 100%. The term "substantially free of" as used herein can mean having none or having a trivial amount of, such that the amount of material present does not affect the material properties of the composition including the material, such that about 0 wt % to about 5 wt % of the composition is the material, or about 0 wt % to about 1 wt %, or about 5 wt % or less, or less than, equal to, or greater than about 4.5 wt %, 4, 3.5, 3, 2.5, 2, 1.5, 1, 0.9, 0.8, 0.7, 0.6, 0.5, 0.4, 0.3, 0.2, 0.1, 0.01, or about 0.001 wt % or less, or about 0 wt %.

Method of Forming a Graphene Film.

In various aspects, the present invention provides a method of forming a graphene film. The method includes depositing a carbon source onto a substrate within a deposition environment including a vacuum to form the graphene film on the substrate. The carbon source includes coal, a coal component, or a combination thereof.

The carbon source can include any suitable coal. The coal or coal component is a solid. The coal can be any suitable coal. The coal can be anthracite coal, bituminous coal, subbituminous coal, lignite coal, or a combination thereof. The coal can include naturally-sourced coal (e.g., coal that has not been upgraded and/or modified). The coal can include modified coal and/or upgraded coal, compared to naturally-sourced coal; for example, the coal can include coal that is acid-cleaned, that includes reduced heteroatom content compared to naturally-sourced coal, reduced ash content compared to naturally-sourced coal, reduced oxygen content compared to naturally-sourced coal, additional functional group modifications compared to naturally-sourced coal, or a combination thereof. The carbon source can include or be lignite coal. The carbon source can include or be ND lignite coal. A carbon source including a coal component can include any one or more solid components of a coal described herein. A carbon source including a coal component can include or be a coal-derived residue that has been heated to a temperature such as 1000° C. to 3000° C., or less than or equal to 3000° C. and greater than or equal to 1000° C., 1200° C., 1500° C., 1600° C., 2000° C., 2200° C., 2500° C., 2800° C. The coal, coal component, or combination thereof, can be any suitable proportion of the carbon source, such as 10 wt % to 100 wt % of the carbon source, 50 wt % to 100 wt %, or greater than or equal to 10 wt %, 20, 30, 40, 50, 60, 70, 80, 90, 95, 96, 97, 98, or 99 wt %.

The coal and/or coal component can be in the form of particles. The particles can have a largest dimension of 1 nm to 1,000 microns, or 1 nm to 100 microns, or less than or equal to 1,000 microns but equal to or greater than 1 nm, 5, 10, 25, 50, 75, 100, 150, 200, 250, 500, 750 nm, 1 micron, 2, 3, 4, 5, 10, 15, 20, 25, 30, 35, 40, 45, 50, 60, 70, 80, 90, 100, 150, 200, 250, 500, or 750 microns.

In some embodiments, 100 wt % of the carbon source is the coal, coal component, or a combination thereof (e.g., the carbon source can be substantially free of materials other than the coal, other than the coal component, or other than the coal and the coal component, such as free of natural gas and/or a component thereof). In other embodiments, in addition to the coal or coal component, other components can form a suitable proportion of the carbon source, such as a natural gas, a natural gas component, or a combination thereof. The natural gas or natural gas component can be 0.01 wt % to 90 wt % of the carbon source, or less than or equal to 90 wt % but greater than or equal to 0.01 wt %, 0.1, 1, 2, 3, 4, 5, 6, 8, 10, 15, 20, 25, 30, 35, 40, 45, 50, 55, 60, 65, 70, 75, 80, or 85 wt %. In some embodiments, the natural gas can be some or all of a gas used to entrain the coal and/or coal component. In some embodiments, a gas can be used to entrain a carbon source including a natural gas and/or natural gas component, such that the carrier gas that entrains the coal and/or coal component includes both the gas and the natural gas and/or natural gas component.

The method can include depositing the carbon source onto the substrate including injecting the carbon source entrained in a carrier gas into the deposition environment. The carrier gas can include an inert gas, hydrogen, or a combination thereof. The gas can include argon and hydrogen. For example, the gas can include 1 vol % to 99 vol % hydrogen, 2 vol % to 30 vol % hydrogen, or 5 vol % to 15 vol % hydrogen, or less than or equal to 99 wt % and greater than or equal to 1 vol %, 2, 4, 6, 8, 10, 12, 14, 16, 18, 20, 25, 30, 35, 40, 45, 50, 55, 60, 65, 70, 75, 80, 85, 90, or 95 vol %, with the remainder inert gas such as argon.

The substrate on which the graphene film is deposited can be any suitable substrate. The substrate can include a metal or an alloy thereof. The substrate can include nickel, aluminum, quartz, copper, or a combination thereof. The substrate can include elemental copper. The substrate can be a foil.

The vacuum in the deposition environment during the deposition of the graphene film can be any suitable vacuum, such as 0.5 kPa to 50 kPa, 1 kPa to 20 kPa, or 6.5 kPa to 7.0 kPa, or less than or equal to 50 kPa but greater than or equal to 0.5 kPa, 1, 2, 3, 4, 5, 6, 7, 8, 9, 10, 11, 12, 13, 14, 15, 16, 17, 18, 19, 20, 25, 30, 35, 40, or 45 kPa. The deposition environment can be a chamber, such as a chamber in an apparatus for performing CVD, such as a tube-furnace (e.g., a vacuum chamber with a furnace that heats the vacuum chamber, and with an injector for injecting the entrained carbon source).

During the depositing of the graphene film, the deposition environment can have any suitable initial temperature, such as 800° C. to 1200° C., 950° C. to 1050° C., or less than or equal to 1200° C. but greater than or equal to 800° C., 820, 840, 860, 880, 900, 920, 940, 960, 980, 1,000, 1,020, 1,040, 1,060, 1,080, 1,100, 1,120, 1,140, 1,160, or 1,180° C. The depositing can include cooling the deposition environment from the initial temperature to a lower final temperature. The final temperature can be any suitable final temperature such that the graphene film is formed, such as room temperature, or 20° C. to 30° C. The cooling of the deposition environment from the initial temperature to the final temperature can include active cooling, passive cooling, or a combination thereof. The cooling of the deposition environment from the initial temperature to the final temperature includes cooling at any suitable rate, such as a rate of 1-100° C./min, 15-25° C./min, or less than or equal to 100° C./min but greater than or equal to 1° C./min, 2, 4, 6, 8, 10, 12, 14, 16, 18, 20, 22, 24, 26, 30, 35, 40, 50, 60, 70, 80, or 90° C./min.

During the deposition of the graphene film, the deposition environment can be substantially free of oxygen. For example, the deposition environment can include an oxygen concentration of ≤0.01 vol %, or ≤0.0001 vol %.

The deposition environment under vacuum during the deposition can include an inert gas, hydrogen, or a combination thereof. The deposition environment can include argon, nitrogen, hydrogen, or a combination thereof. The deposition environment can include argon and hydrogen. For example, the gas can include 1 vol % to 99 vol % hydrogen, 2 vol % to 30 vol % hydrogen, or 5 vol % to 15 vol % hydrogen, or less than or equal to 99 wt % and greater than or equal to 1 vol %, 2, 4, 6, 8, 10, 12, 14, 16, 18, 20, 25, 30, 35, 40, 45, 50, 55, 60, 65, 70, 75, 80, 85, 90, or 95 vol %, with the remainder inert gas such as argon.

The method can include, prior to the deposition, preparing the chamber for the deposition by substantially eliminating undesirable gases and other materials from the chamber. For example, the method can include prior to the depositing performing one or more evacuation/flush cycles and/or heat/flush/evacuation cycles.

For example, the method can include, prior to the depositing, performing at least one evacuation/flush cycle including evacuating the deposition environment and then flushing the deposition environment with an inert gas, hydrogen, or a combination thereof. The evacuation/flush cycle can be performed more than once, such as 2, 3, 4, or 5 or more times. The evaluation can include forming a vacuum in the deposition environment, such as having a pressure of 1 kPa to 90 kPa, or 50 kPa to 80 kPa, or less than or equal to 90 kPa but greater than or equal to 1 kPa, 2, 3, 4, 5, 6, 7, 8, 9, 10, 11, 12, 13, 14, 15, 16, 17, 18, 19, 20, 25, 30, 35, 40, 45, 50, 55, 60, 65, 70, 75, 80, or 85 kPa. The evacuation/flush cycle can be performed at any suitable temperature, such as room temperature.

The method can include, prior to the depositing, performing at least one heat/flush evacuation cycle of the deposition environment including heating the deposition environment to 300° C. to 1000° C., flushing the deposition environment with an inert gas, hydrogen, or a combination thereof, and evacuating the deposition environment. The heat/flush/evacuation cycle includes heating, then flushing, then evacuating the deposition environment. The heating of the heat/flush/evacuation cycle can include heating to 400-600° C. (e.g., less than or equal to 600° C. but greater than or equal to 400° C., 420, 440, 460, 480, 500, 520, 540, 560, or 580° C.). The heating of the heat/flush/evacuation cycle can include heating to 400-600° C. and maintaining for 1 min to 1 h, or for 10 min to 20 min, or for 1 h or less but greater than or equal to 1 min, 2 min, 4, 6, 8, 10, 12, 14, 16, 18, 20, 22, 24, 26, 28, 30, 35, 40, 45, 50, or 55 min. The evacuating can include forming a vacuum of 1 kPa to 50 kPa, or 1 kPa to 20 kPa, or 6.5 kPa to 7.0 kPa, or less than or equal to 50 kPa but greater than or equal to 1 kPa, 2, 3, 4, 5, 6, 7, 8, 9, 10, 12, 14, 16, 18, 20, 25, 30, 35, 40, or 45 kPa.

The method can include, prior to the depositing, first performing at least one evacuation/flush cycle at room temperature including evacuating the deposition environment to 50 kPa to 80 kPa and flushing the deposition environment with an inert gas and hydrogen; and then performing at least one heat/flush/evacuation cycle of the deposition environment including heating the deposition environment to 400-600° C., flushing the deposition environment with an inert gas and hydrogen, and evacuating the deposition environment to a pressure of 6.5 kPa to 7.0 kPa.

The method can include leaving the formed graphene film on the substrate or removing the graphene film from the substrate. The removing can include peeling, dissolution of the substrate, destruction of the substrate, or a combination thereof.

The formed graphene film can have any suitable thickness. The graphene film can have a substantially uniform thickness. The graphene film can be a single carbon atom thick, or multiple carbon atoms thick, such as 2-100 carbon atoms thick, 2-50, 2-20, 2-10, 2-5, 2-3, or less than or equal to 100 carbon atoms thick but greater than or equal to 2, 3, 4, 5, 6, 7, 8, 9, 10, 12, 14, 16, 18, 20, 25, 30, 35, 40, 45, 50, 60, 70, 80, or 90 carbon atoms thick.

Graphene Film.

In various aspects, the present invention provides a graphene film. The graphene film can be any suitable graphene film formed by an embodiment of the method described herein.

In various aspects, the present invention provides a graphene film including a CVD-deposited carbon source. The carbon source includes coal, a component extracted from coal, or a combination thereof.

Apparatus.

In various aspects, the present invention provides an apparatus. The apparatus can be used to carry out an embodiment of the method of the present invention. The apparatus includes a chemical vapor deposition unit that includes a deposition environment. The apparatus also includes an injector unit that is configured to inject a carbon source entrained in a gas into the deposition environment for deposition on a substrate and formation of a graphene film on the substrate. The carbon source includes coal, a coal component, or a combination thereof.

An embodiment of the apparatus is shown in FIG. 1, illustrating a schematic of the CVD system 5. The system includes gas tanks 10, gas-mixing manifold 20, EC feed system 30, tube furnace 40, pressure gauges 50, and vacuum pump 60. The gas supply 10 can be appropriately mixed in gas mixing system 20 and can entrain coal from the EC feed system 30 for injection into the deposition chamber in tube furnace 40. The vacuum pump 60 can be used to generate a vacuum in the deposition chamber, using the compound pressure gauges 50 to determine the vacuum therein.

EXAMPLES

Various embodiments of the present invention can be better understood by reference to the following Examples which are offered by way of illustration. The present invention is not limited to the Examples given herein.

The lignite coal used in these examples was North Dakota (ND) lignite that was obtained from Center Mine. The properties of the raw coal sample are shown in Table 1. Prior to the LPEC-CVD experiments, the raw coal was crushed to ¼-inch (6.35 mm) particle size and cleaned with hydrochloric acid to substantially decrease the concentration of ash-producing inorganic elements. The acid cleaned coal was further crushed to −325 mesh (≤44 μm) particles and about 3.0 g was used for the experiment.

TABLE 1

Properties of Raw Center Mine Lignite Coal.

| | Prox-Ult-Btu | XRF Analysis | |
| --- | --- | --- | --- |
| Parameter (wt %) | Analysis Raw Center Coal | Component (wt %) | Raw Center Coal |
| Moisture | 21.51 | $SiO_2$ | 26.64 |
| Volatile Matter | 44.52 | $Al_2O_3$ | 13.37 |
| Fixed Carbon* | 47.42 | $Fe_2O_3$ | 11.44 |
| Ash | 8.06 | $TiO_2$ | 0.53 |
| Hydrogen | 4.31 | $P_2O_5$ | 0.09 |
| Carbon | 62.96 | CaO | 16.82 |
| Nitrogen | 0.99 | MgO | 6.20 |
| Sulfur | 1.10 | $Na_2O$ | 3.12 |
| Oxygen* | 22.57 | $K_2O$ | 0.90 |
| Heating Value (BTU) | 10,387 | $SO_3$ | 20.36 |

*Calculated by difference.

Example 1. Production of Graphene Films on Copper

This Example uses an entrained-coal (EC) delivery approach with modification of the chemical vapor deposition (CVD) technique to incorporate a low-pressure EC delivery system. The coal used was ND lignite. A schematic of the CVD system 5 is shown in FIG. 1. The system includes gas tanks 10, gas-mixing manifold 20, EC feed system 30, tube furnace 40, pressure gauges 50, and vacuum pump 60. The system includes a high-temperature tube furnace 40 (HTTF) that was also equipped with a vacuum pump 60 to create low pressure and/or vacuum conditions. Copper foil substrates were placed in the tube's heating zone on refractory support. The system was evacuated to about 20 inHg (67.7 kPa), backfilled and flushed with argon/hydrogen mixture (~95% Ar and 5% $H_2$). The evacuation, backfill/flush cycle was repeated three times, and the system was then brought to 1 psi (6.9 kPa) and sealed. The temperature was increased at 10° C./min to 500° C. and held steady for 15 min, and the system was then flushed again with Ar/$H_2$ and evacuated. After 15 min, the temperature was raised to 1000° C. at the same heating rate. The system vacuum was adjusted to about 2 inHg (6.7 kPa), and entrained-coal (EC) flow was initiated, using the Ar/$H_2$ mixture as the carrier gas. The EC flow was maintained for 30 min and the system was brought to about 1 psi (6.9 kPa) with Ar/$H_2$ and sealed, while the temperature was decreased to room temperature at 20° C./min. The entire furnace cooled to room temperature overnight, and the substrates were recovered for analysis.

Example 2. Results and Analysis

Figure 2A:
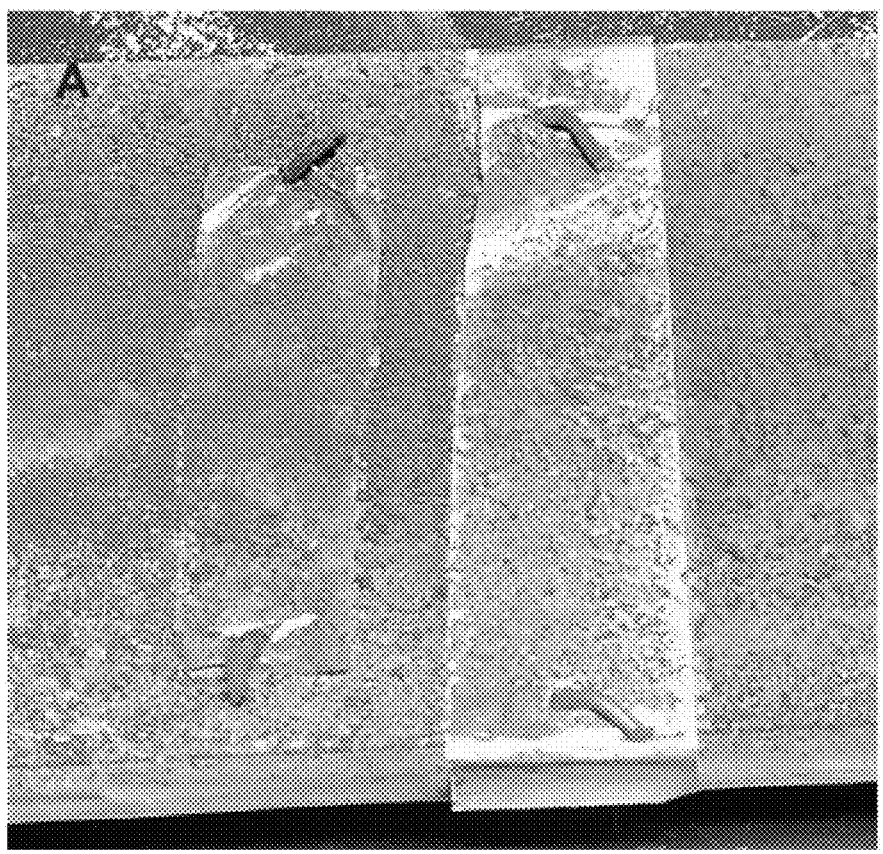
FIGS. 2A-2B illustrate images of graphene films on copper substrates, in accordance with various embodiments.
Figure 2B:
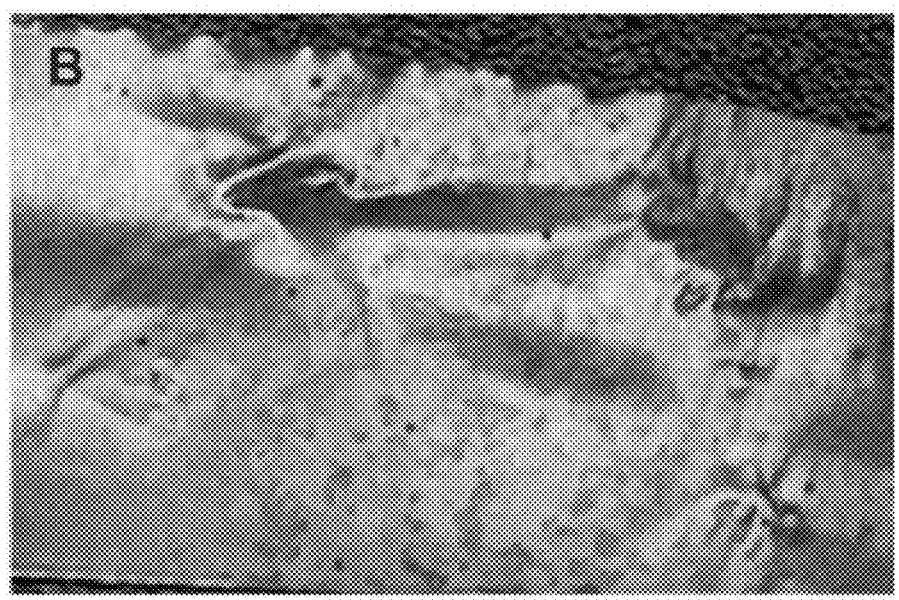

The CVD system was designed and built to prepare graphene films or layered graphene starting from carbon precursors such as coal or coal-derived products. FIGS. 2A-B show images of copper substrates with coal-derived deposited material on the substrates. FIG. 2A shows the substrate as recovered from the system with ash covering the Cu substrate. In FIG. 2B, the ash was removed to expose the substrate with the stained patches representing carbon material deposited on the substrate.

Figure 3A:
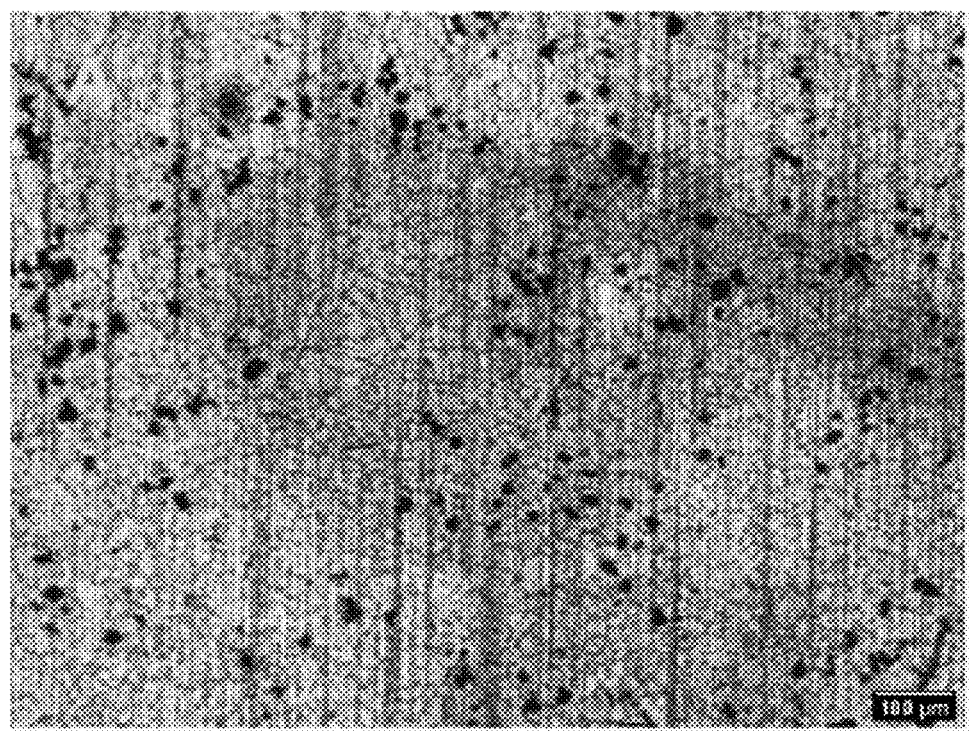
FIGS. 3A-D illustrate optical microscopy images of graphene films on a copper substrate, in accordance with various embodiments.
Figure 3B:
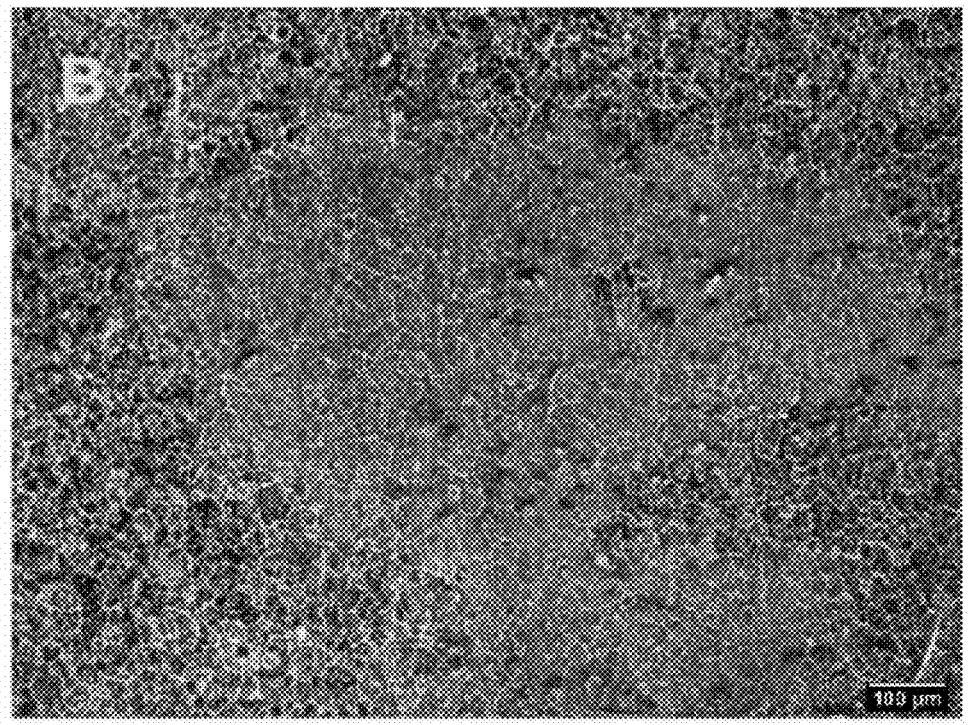
Figure 3C:
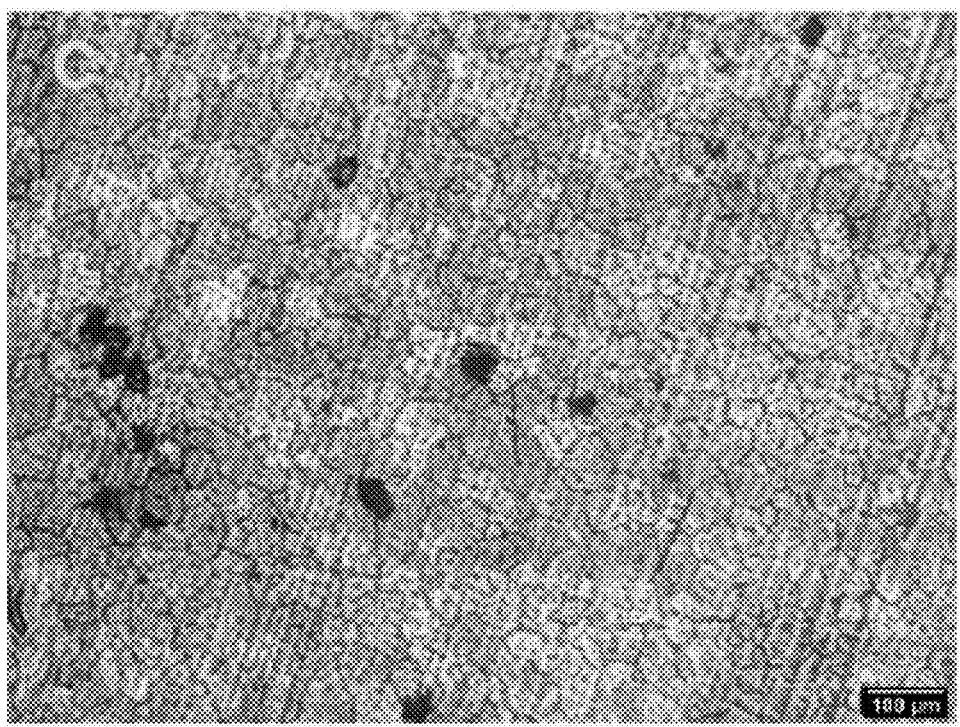
Figure 3D:
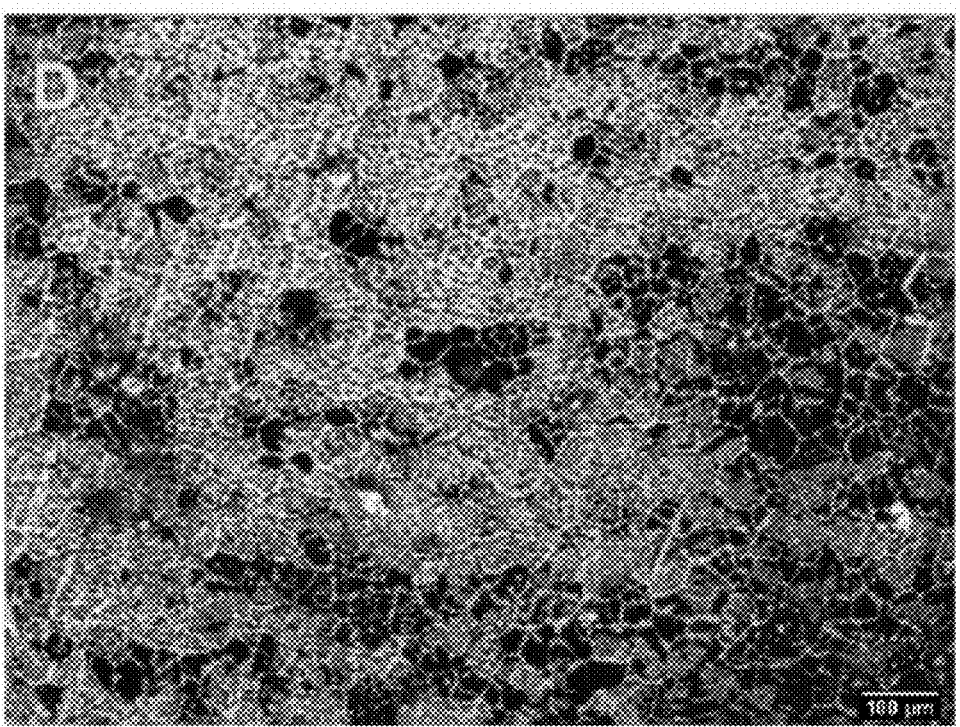

FIGS. 3A-D show optical microscopy images acquired in reflected light mode (A, C) and darkfield mode (B, D). FIG. 3A and its corresponding darkfield FIG. 3B were obtained from one of the brown stained spots on the substrate, while FIG. 3C and its darkfield FIG. 3D were obtained from a spot near the darker corner of FIG. 2B. The images show the carbon-based coating on the Cu substrate, which looks brownish in reflected light and whitish, translucent to transparent film on the substrate in darkfield mode. The darkfield images FIGS. 3C-D show that the films are slightly thicker than can be discerned from their corresponding reflected light images in FIGS. 3A-B.

Figure 4A:
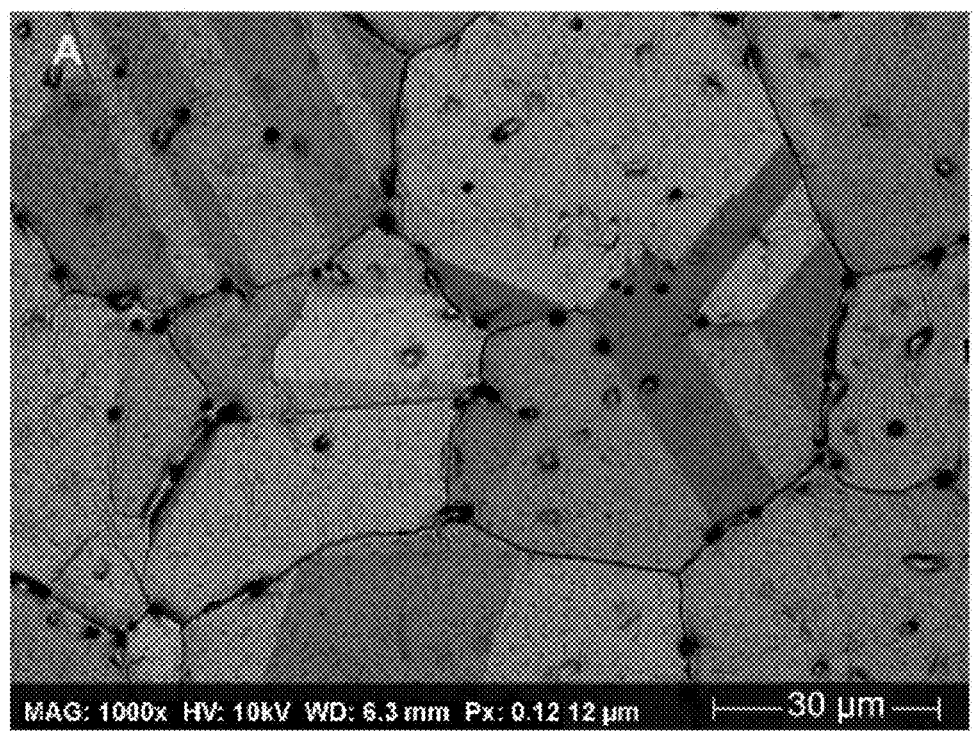
FIG. 4A illustrates a field emission scanning electron microscope (FESEM) photomicrograph of a copper substrate having a graphene film thereon, acquired in backscatter electron mode, in accordance with various embodiments.
Figure 4B:
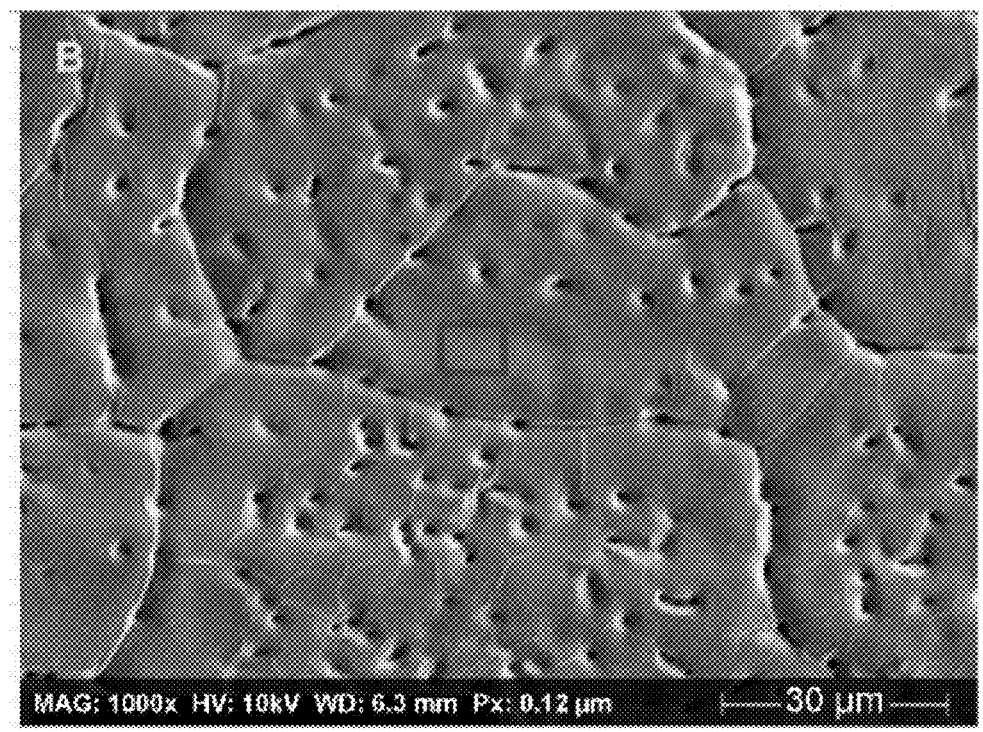
FIG. 4B illustrates a FESEM photomicrograph of a copper substrate having a graphene film thereon, acquired in secondary electron mode, in accordance with various embodiments.
Figure 4C:
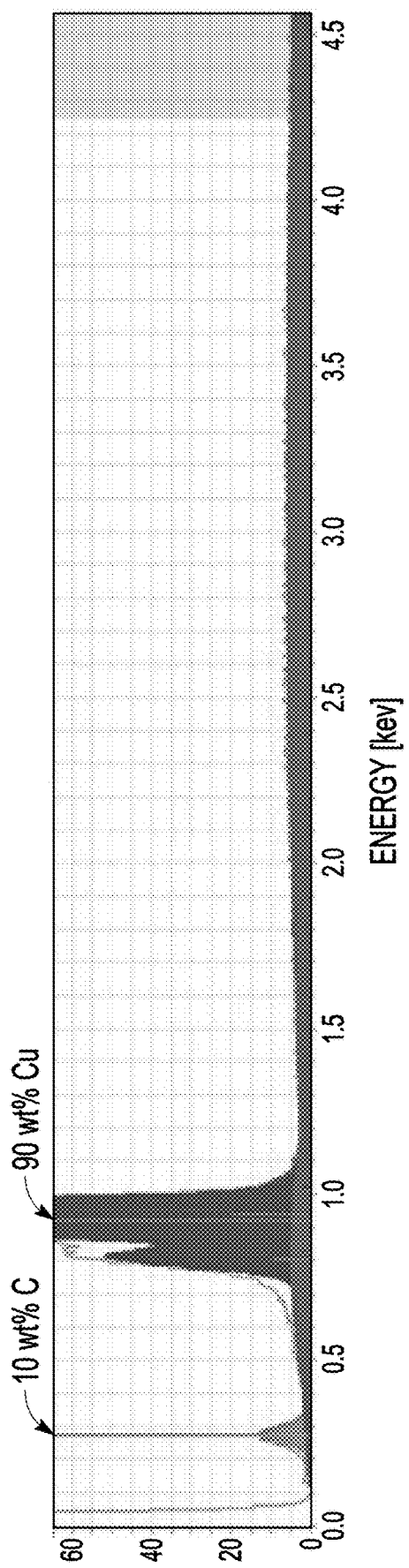
FIG. 4C is an energy-dispersive x-ray spectrum of the boxed area of FIG. 4B, in accordance with various embodiments.
Figure 5A:
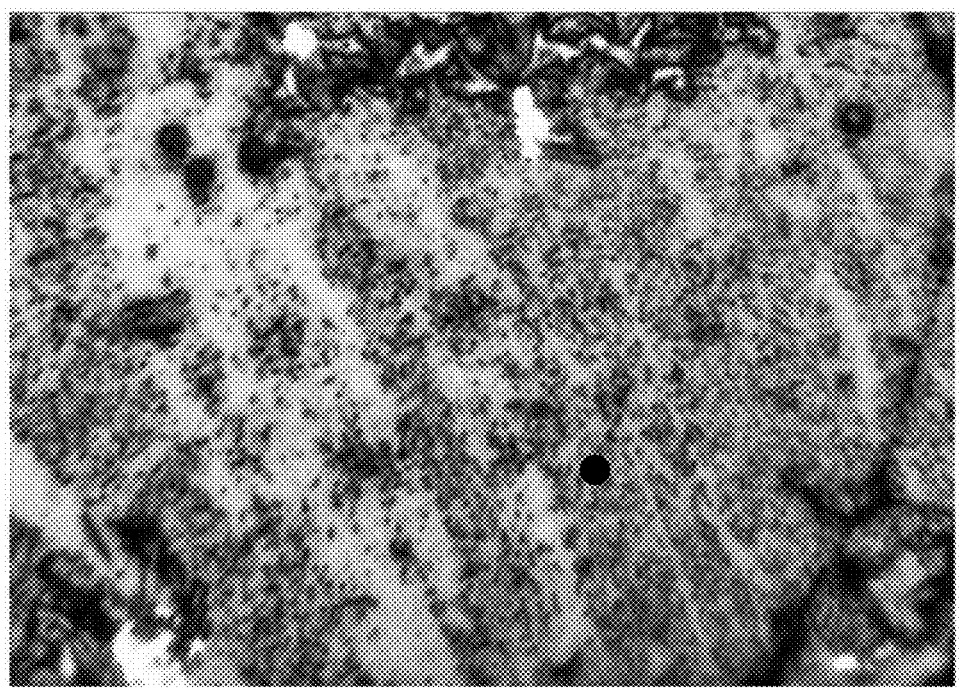
FIG. 5A illustrates a photomicrograph of a Cu substrate coated with graphene film, in accordance with various embodiments.
Figure 5B:
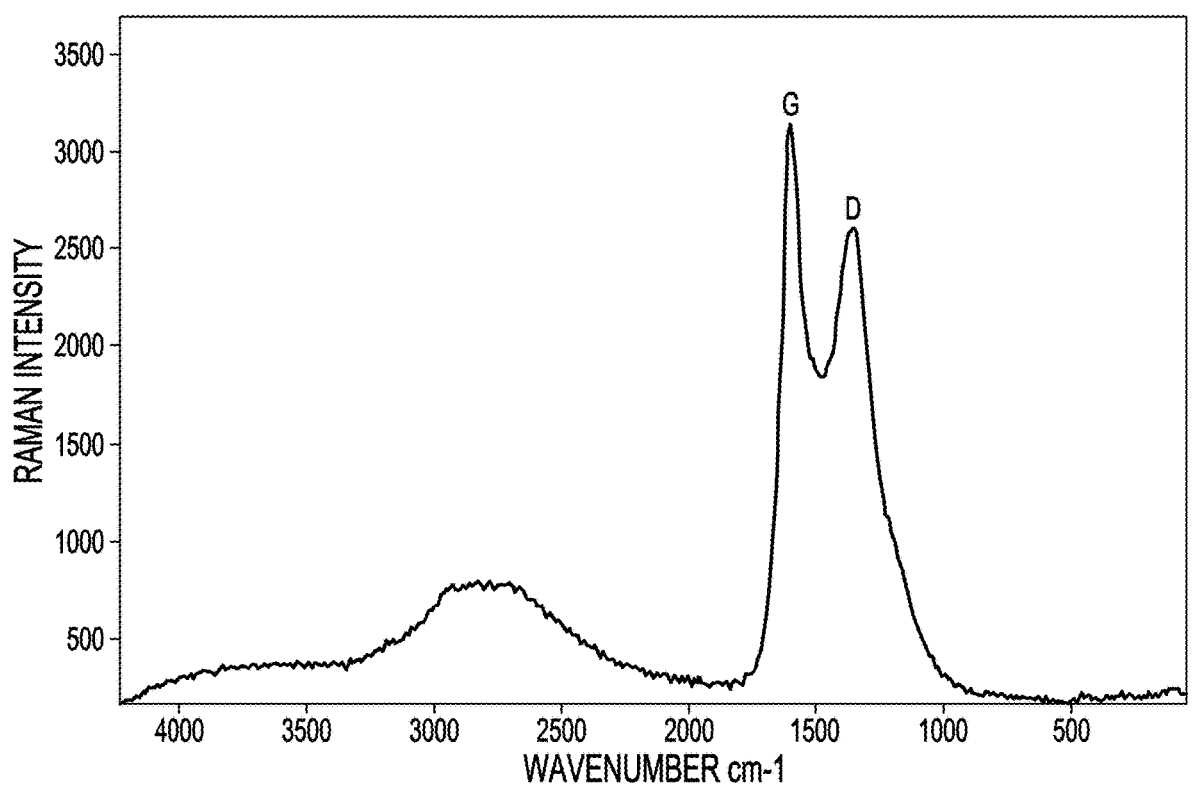
FIG. 5B illustrates shows a Raman spectrum obtained from the portion of the photomicrograph in FIG. 5A marked with the black dot, in accordance with various embodiments.
Figure 6A:
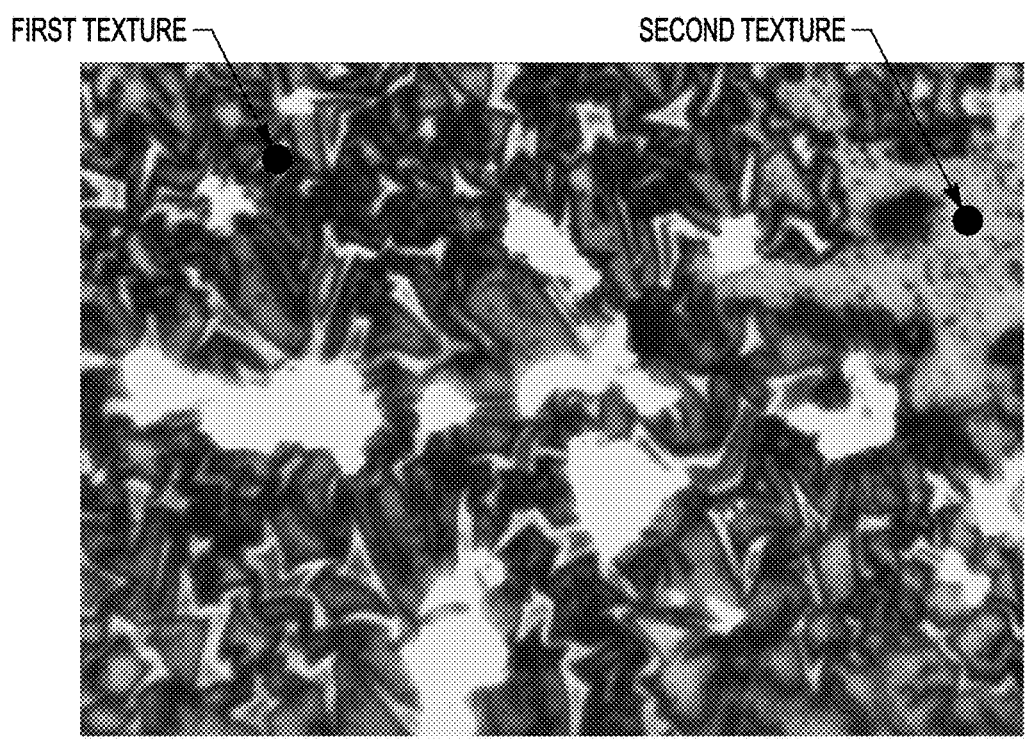
FIG. 6A illustrates a photomicrograph of the graphene film on a Cu substrate that shows multiple textures, in accordance with various embodiments.
Figure 6B:
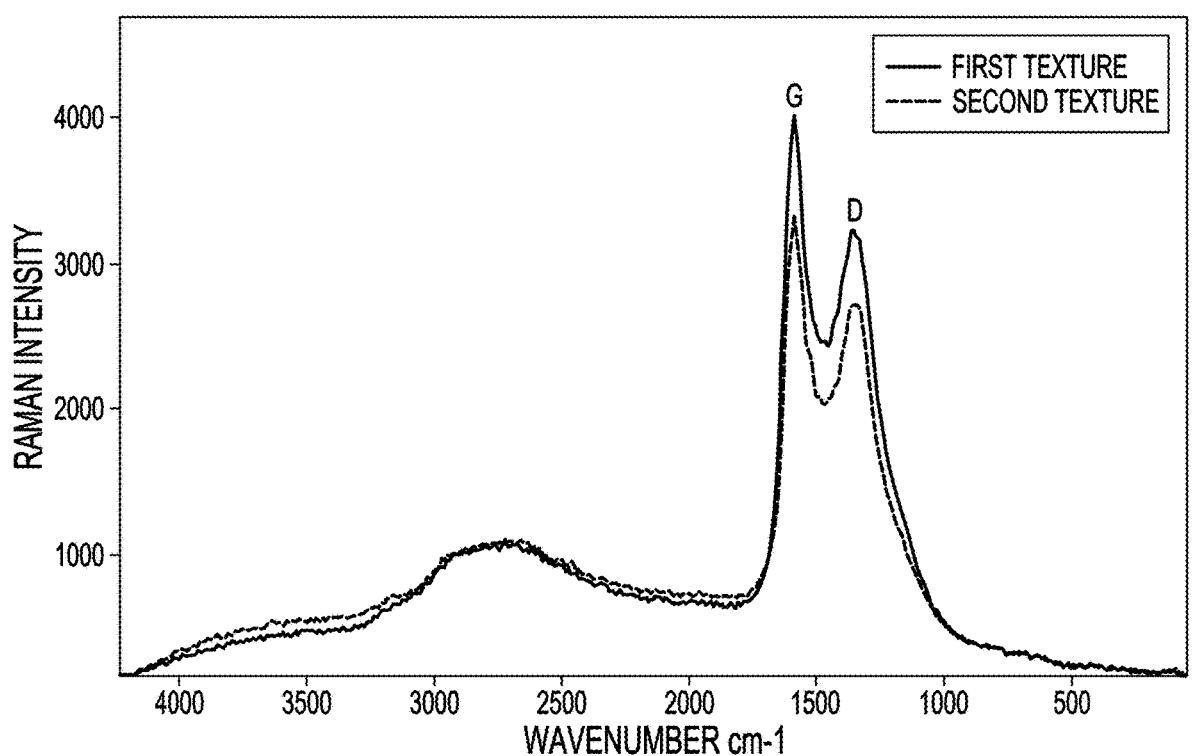
FIG. 6B illustrates a Raman spectrum of both the first texture and second texture labeled in FIG. 6A, in accordance with various embodiments.

FIGS. 4A-B illustrate FESEM photomicrographs of Cu substrates coated with graphene film. The images were acquired in backscatter electron mode (A) and secondary electron mode (B). Although it was challenging to observe the morphological features of the film, EDS analysis confirmed the presence of carbon on the surface of the Cu substrate. The FESEM backscatter electron image in FIG. 4A does not seem to show any coating that may be on the substrate, but the secondary electron image (FIG. 4B) does indicate some surface film. The energy-dispersive x-ray spectroscopy (EDS) spectrum in FIG. 4C shows that C and Cu were the predominant elements present on the substrate in the area with the box in FIG. 4B. The EDS spectrum FIG. 4C illustrates a composition of the box in FIG. 4B to be about 10 wt % C and 90 wt % Cu. The range of C concentration was observed to be about 5 wt % to 12 wt %, with the balance being dominantly Cu and minor to trace amounts of other coal-derived impurities. FIG. 5A shows a photomicrograph of the Cu substrate coated with graphene film. FIG. 5B shows a Raman spectrum obtained from the portion of the photomicrograph in FIG. 5A marked with the black dot. The Raman spectrum in FIG. 5B shows typical G and D bands that are characteristic of graphene materials. FIG. 6A illustrates a photomicrograph of the graphene film on the Cu substrate that shows multiple textures, including the first texture which occurred at the jagged lighter areas in the image and that appeared greenish, and the second texture labeled in the photomicrograph. FIG. 6B illustrates a Raman spectrum of both the first texture and second texture labeled in FIG. 6A, and indicates that the first texture had a higher graphene concentration than the second texture. Comparison of FIGS. 6B and 5B shows many similarities and further illustrates that the two different textures of FIG. 6A are graphene materials having different graphene concentrations.

While the graphene film characterization results are preliminary and need more investigation for a robust conclusion, the system design showed initial success. Optical microscopy images showed a semitransparent film on the substrates, which was further confirmed by SEM EDS analysis as containing about 5-12 wt % carbon on the substrates. Additional modifications are needed to improve the feed system delivery to keep out any traces of oxygen in the deposition chamber. Also, variable graphene film deposition conditions and characterizations are required to determine the deposited film type, quality, and properties. With additional process and system optimization, the entrained coal approach coupled with the modified CVD system is envisioned to be useful for making layered graphene thin film materials from coal-derived intermediates in a manner that facilitates continuous processing, integration, and scale-up.

In conclusion, a modified CVD system was designed, assembled, and tested for making graphene films and layered graphene. Carbon films were successfully made with this system.

The terms and expressions that have been employed are used as terms of description and not of limitation, and there is no intention in the use of such terms and expressions of excluding any equivalents of the features shown and described or portions thereof, but it is recognized that various modifications are possible within the scope of the embodiments of the present invention. Thus, it should be understood that although the present invention has been specifically disclosed by specific embodiments and optional features, modification and variation of the concepts herein disclosed may be resorted to by those of ordinary skill in the art, and that such modifications and variations are considered to be within the scope of embodiments of the present invention.

Exemplary Embodiments

The following exemplary embodiments are provided, the numbering of which is not to be construed as designating levels of importance:

Embodiment 1 provides a method of forming a graphene film, the method comprising:

depositing a carbon source onto a substrate within a deposition environment comprising a vacuum to form the graphene film on the substrate, wherein the carbon source comprises coal, a coal component, or a combination thereof.

Embodiment 2 provides the method of Embodiment 1, wherein the coal and the coal component are solids.

Embodiment 3 provides the method of any one of Embodiments 1-2, wherein the carbon source further comprises natural gas, a natural gas component, or a combination thereof.

Embodiment 4 provides the method of Embodiment 3, wherein depositing the carbon source onto the substrate comprises injecting the coal, coal component, or combination thereof into the deposition environment entrained in a gas comprising natural gas, a natural gas component, or a combination thereof.

Embodiment 5 provides the method of any one of Embodiments 1-4, wherein the carbon source is free of natural gas.

Embodiment 6 provides the method of any one of Embodiments 1-5, wherein the carbon source comprises particulate coal.

Embodiment 7 provides the method of any one of Embodiments 1-6, wherein the coal comprises anthracite coal, bituminous coal, subbituminous coal, lignite coal, or a combination thereof.

Embodiment 8 provides the method of any one of Embodiments 1-7, wherein the coal comprises naturally-sourced coal.

Embodiment 9 provides the method of any one of Embodiments 1-8, wherein the coal comprises modified coal and/or upgraded coal, compared to naturally-sourced coal.

Embodiment 10 provides the method of any one of Embodiments 1-9, wherein the carbon source comprises a coal residue that has been heated, coal that is acid-cleaned, that comprises reduced heteroatom content compared to naturally-sourced coal, reduced ash content compared to naturally-sourced coal, reduced oxygen content compared to naturally-sourced coal, additional functional group modifications compared to naturally-sourced coal, or a combination thereof.

Embodiment 11 provides the method of any one of Embodiments 1-10, wherein the coal comprises lignite coal.

Embodiment 12 provides the method of any one of Embodiments 1-11, wherein the coal comprises ND lignite coal.

Embodiment 13 provides the method of any one of Embodiments 1-12, wherein the carbon source comprises coal, wherein the coal is in the form of particles.

Embodiment 14 provides the method of Embodiment 13, wherein the coal particles have a largest dimension of 1 nm to 1,000 microns.

Embodiment 15 provides the method of any one of Embodiments 13-14, wherein the coal particles have a largest dimension of 1 nm to 100 microns.

Embodiment 16 provides the method of any one of Embodiments 13-15, wherein depositing the carbon source onto the substrate comprises injecting the carbon source entrained in a gas into the deposition environment.

Embodiment 17 provides the method of Embodiment 16, wherein the gas comprises an inert gas, hydrogen, or a combination thereof.

Embodiment 18 provides the method of any one of Embodiments 16-17, wherein the gas comprises argon and hydrogen.

Embodiment 19 provides the method of any one of Embodiments 1-18, wherein the substrate comprises a metal or an alloy thereof.

Embodiment 20 provides the method of any one of Embodiments 1-19, wherein the substrate comprises nickel, aluminum, quartz, copper, or a combination thereof.

Embodiment 21 provides the method of any one of Embodiments 1-20, wherein the substrate comprises elemental copper.

Embodiment 22 provides the method of any one of Embodiments 1-21, wherein the substrate comprises a foil.

Embodiment 23 provides the method of any one of Embodiments 1-22, wherein the vacuum comprises 1 kPa to 20 kPa.

Embodiment 24 provides the method of any one of Embodiments 1-23, wherein the vacuum comprises 6.5 kPa to 7.0 kPa.

Embodiment 25 provides the method of any one of Embodiments 1-24, wherein the deposition is performed in a chamber that comprises the deposition environment.

Embodiment 26 provides the method of any one of Embodiments 1-25, wherein the deposition is performed in a tube-furnace.

Embodiment 27 provides the method of any one of Embodiments 1-26, wherein the deposition environment comprises an initial temperature of 800° C. to 1200° C.

Embodiment 28 provides the method of any one of Embodiments 1-27, wherein the deposition environment comprises an initial temperature of 950° C. to 1050° C.

Embodiment 29 provides the method of any one of Embodiments 27-28, wherein the depositing further comprises cooling the deposition environment from the initial temperature to a lower final temperature.

Embodiment 30 provides the method of Embodiment 29, wherein the final temperature is room temperature.

Embodiment 31 provides the method of any one of Embodiments 29-30, wherein the final temperature is 20° C. to 30° C.

Embodiment 32 provides the method of any one of Embodiments 29-31, wherein the cooling of the deposition environment from the initial temperature to the final temperature comprises active cooling, passive cooling, or a combination thereof.

Embodiment 33 provides the method of any one of Embodiments 29-32, wherein the cooling of the deposition environment from the initial temperature to the final temperature comprises cooling at a rate of 1-100° C./min.

Embodiment 34 provides the method of any one of Embodiments 29-33, wherein the cooling of the deposition environment from the initial temperature to the final temperature comprises cooling at a rate of 15-25° C./min.

Embodiment 35 provides the method of any one of Embodiments 1-34, wherein the deposition environment is substantially free of oxygen.

Embodiment 36 provides the method of any one of Embodiments 1-35, wherein the deposition environment comprises an oxygen concentration of ≤0.01 vol %.

Embodiment 37 provides the method of any one of Embodiments 1-36, wherein the deposition environment comprises an oxygen concentration of ≤0.0001 vol %.

Embodiment 38 provides the method of any one of Embodiments 1-37, wherein the deposition environment comprises an inert gas, hydrogen, or a combination thereof.

Embodiment 39 provides the method of any one of Embodiments 1-38, wherein the deposition environment comprises argon, nitrogen, hydrogen, or a combination thereof.

Embodiment 40 provides the method of any one of Embodiments 1-39, wherein the deposition environment comprises argon and hydrogen.

Embodiment 41 provides the method of any one of Embodiments 1-40, wherein the deposition environment comprises 70-98 vol % argon and 2-30 vol % hydrogen.

Embodiment 42 provides the method of any one of Embodiments 1-41, wherein the method further comprises, prior to the depositing, performing at least one evacuation/flush cycle comprising evacuating the deposition environment and flushing the deposition environment with an inert gas, hydrogen, or a combination thereof.

Embodiment 43 provides the method of Embodiment 42, comprising performing the evacuation/flush cycle more than once.

Embodiment 44 provides the method of any one of Embodiments 42-43, wherein the evacuation comprises forming a vacuum of 1 kPa to 90 kPa.

Embodiment 45 provides the method of any one of Embodiments 42-44, wherein the evacuation comprises forming a vacuum of 50 kPa to 80 kPa.

Embodiment 46 provides the method of any one of Embodiments 42-45, wherein the evacuation/flush cycle is performed at room temperature.

Embodiment 47 provides the method of any one of Embodiments 1-46, wherein the method further comprises, prior to the depositing, performing at least one heat/flush/evacuation cycle of the deposition environment comprising heating the deposition environment to 300° C. to 1000° C., flushing the deposition environment with an inert gas, hydrogen, or a combination thereof, and evacuating the deposition environment.

Embodiment 48 provides the method of Embodiment 47, wherein the heating of the heat/flush/evacuation cycle comprises heating to 400-600° C.

Embodiment 49 provides the method of any one of Embodiments 47-48, wherein the heating of the heat/flush/evacuation cycle comprises heating to 400-600° C. and maintaining for 1 min to 1 h.

Embodiment 50 provides the method of any one of Embodiments 47-49, wherein the heating of the heat/flush/evacuation cycle comprises heating to 400-600° C. and maintaining for 10 min to 20 min.

Embodiment 51 provides the method of any one of Embodiments 47-50, wherein the evacuation of the heat/flush/evacuation cycle comprises forming a vacuum of 1 kPa to 20 kPa.

Embodiment 52 provides the method of any one of Embodiments 47-51, wherein the evacuation of the heat/flush/evacuation cycle comprises forming a vacuum of 6.5 kPa to 7.0 kPa Embodiment 53 provides the method of any one of Embodiments 1-52, wherein the method further comprises, prior to the depositing:
performing at least one evacuation/flush cycle at room temperature comprising evacuating the deposition environment to 50 kPa to 80 kPa and flushing the deposition environment with an inert gas and hydrogen; and
performing at least one heat/flush/evacuation cycle of the deposition environment comprising heating the deposition environment to 400-600° C., flushing the deposition environment with an inert gas and hydrogen, and evacuating the deposition environment to a pressure of 6.5 kPa to 7.0 kPa.

Embodiment 54 provides the method of any one of Embodiments 1-53, further comprising removing the graphene film from the substrate.

Embodiment 55 provides the method of Embodiment 54, wherein the removing comprises peeling, dissolution of the substrate, destruction of the substrate, or a combination thereof.

Embodiment 56 provides the method of any one of Embodiments 1-55, wherein the graphene film has a substantially uniform thickness.

Embodiment 57 provides the method of any one of Embodiments 1-56, wherein the graphene film is a single carbon atom thick.

Embodiment 58 provides the method of any one of Embodiments 1-57, wherein the graphene film is multiple carbon atoms thick.

Embodiment 59 provides a method of forming a graphene film, the method comprising:
performing at least one evacuation/flush cycle at room temperature comprising evacuating the deposition environment to 1 kPa to 90 kPa and flushing the deposition environment with an inert gas;
performing at least one heat/flush/evacuation cycle of the deposition environment comprising heating the deposition environment to 300° C. to 1000° C., flushing the deposition environment with an inert gas, and evacuating the deposition environment to a pressure of 1 kPa to 90 kPa; and
depositing a carbon source comprising particulate coal having a largest dimension smaller than 100 microns, a particulate component extracted from coal having a largest dimension smaller than 100 microns, or a combination thereof, onto a substrate a metal or an alloy thereof within the deposition environment comprising a vacuum of 1 kPa to 20 kPa to form the graphene film on the substrate, wherein the deposition environment has an oxygen concentration of ≤0.01 vol %, the deposition comprising cooling the deposition environment from an initial temperature of 800° C. to 1200° C. to a lower final temperature of 20° C. to 30° C.

Embodiment 60 provides a graphene film formed by the method of any one of Embodiments 1-59.

Embodiment 61 provides a graphene film comprising a CVD-deposited carbon source, the carbon source comprising coal, a component extracted from coal, or a combination thereof.

Embodiment 62 provides an apparatus for performing the method of any one of Embodiments 1-59, the apparatus comprising:

a chemical vapor deposition unit comprising a deposition environment; and an injector unit that is configured to inject a carbon source entrained in a gas into the deposition environment for deposition on a substrate and formation of a graphene film thereon, the carbon source comprising coal, a coal component, or a combination thereof.

Embodiment 63 provides the method, graphene film, or apparatus of any one or any combination of Embodiments 1-62 optionally configured such that all elements or options recited are available to use or select from.

What is claimed is:

1. A method of forming a graphene film, the method comprising:

entraining a carbon source in a carrier gas comprising hydrogen and an inert gas to form an entrained carbon source, the carbon source comprising coal, a coal component, or a combination thereof, wherein the entraining is performed outside of a deposition chamber;

injecting the entrained carbon source from outside of the deposition chamber to inside the deposition chamber; and depositing the carbon source onto a substrate within the deposition chamber comprising a vacuum to form the graphene film on the substrate.

2. The method of claim 1, wherein the carbon source further comprises natural gas, a natural gas component, or a combination thereof.

3. The method of claim 2, wherein the carrier gas further comprises natural gas, a natural gas component, or a combination thereof.

4. The method of claim 1, wherein the coal comprises anthracite coal, bituminous coal, subbituminous coal, lignite coal, or a combination thereof.

5. The method of claim 1, wherein the coal comprises lignite coal.

6. The method of claim 1, wherein the carbon source comprises coal, wherein the coal is in the form of particles.

7. The method of claim 1, wherein the carrier gas comprises argon and hydrogen.

8. The method of claim 1, wherein the substrate comprises a metal or an alloy thereof.

9. The method of claim 1, wherein the substrate comprises a foil.

10. The method of claim 1, wherein the vacuum comprises 1 kPa to 20 kPa.

11. The method of claim 1, wherein the deposition chamber comprises an initial temperature of 800° C. to 1200° C.

12. The method of claim 1, wherein the deposition chamber comprises an oxygen concentration of $\leq 0.01$ vol %.

13. The method of claim 1, wherein the method further comprises, prior to the depositing, performing at least one evacuation/flush cycle comprising evacuating the deposition chamber and flushing the deposition chamber with an inert gas, hydrogen, or a combination thereof.

14. The method of claim 1, wherein the method further comprises, prior to the depositing, performing at least one heat/flush/evacuation cycle of the deposition chamber comprising heating the deposition chamber to 300° C. to 1000° C., flushing the deposition chamber with an inert gas, hydrogen, or a combination thereof, and evacuating the deposition chamber.

15. The method of claim 1, further comprising removing the graphene film from the substrate.

16. An apparatus comprising:

a chemical vapor deposition unit comprising a deposition chamber;

an entrained carbon feed system configured to entrain a carbon source in a carrier gas comprising hydrogen and an inert gas to form an entrained carbon source outside of the deposition chamber, the carbon source comprising coal, a coal component, or a combination thereof; and an injector unit that is configured to inject the entrained carbon source from outside of the deposition chamber to inside of the deposition chamber for deposition on a substrate and formation of a graphene film thereon.

* * * * *